(12) United States Patent
Tasaki et al.

(10) Patent No.: US 7,416,906 B2
(45) Date of Patent: Aug. 26, 2008

(54) SOLDERING METHOD FOR SEMICONDUCTOR OPTICAL DEVICE, AND SEMICONDUCTOR OPTICAL DEVICE

(75) Inventors: Masutsugu Tasaki, Nishishirakawa-gun (JP); Kenichi Ozawa, Nishishirakawa-gun (JP)

(73) Assignee: Asahi Rubber Inc., Saitama-shi (JP)

( * ) Notice: Subject to any disclaimer, the term of this patent is extended or adjusted under 35 U.S.C. 154(b) by 32 days.

(21) Appl. No.: 11/131,204

(22) Filed: May 18, 2005

(65) Prior Publication Data

US 2006/0263918 A1    Nov. 23, 2006

(51) Int. Cl.
*H01L 21/00* (2006.01)
(52) U.S. Cl. ............................. 438/22; 438/23; 438/26; 257/98; 257/100
(58) Field of Classification Search .................... 438/22, 438/23, 26, 27; 257/98, 100, 103
See application file for complete search history.

(56) References Cited

U.S. PATENT DOCUMENTS 6,953,952 B2 * 10/2005 Asakawa .................... 257/103

2005/0237868 A1 * 10/2005 Nabe et al. ................ 369/44.11
2006/0012967 A1 *  1/2006 Asai et al. .................... 361/764

FOREIGN PATENT DOCUMENTS

| EP | 1 249 874   | 10/2002 |
|----|-------------|---------|
| JP | 4-127667    | 11/1992 |
| JP | 11-222555   | 8/1999  |
| JP | 2001-203395 | 7/2001  |
| JP | 2002-280604 | 9/2002  |
| JP | 2004-146554 | 5/2004  |

* cited by examiner

*Primary Examiner*—Hsien-ming Lee
(74) *Attorney, Agent, or Firm*—Oblon, Spivak, McClelland, Maier & Neustadt, P.C.

(57) ABSTRACT

A method for soldering a semiconductor optical device including a resin-made optical lens to an object by a reflow soldering process using a lead-free solder, and a semiconductor optical device for use in the method. A semiconductor optical device including a silicone resin-made optical lens as the resin-made optical lens is used.

16 Claims, 2 Drawing Sheets

SOLDERING METHOD FOR SEMICONDUCTOR OPTICAL DEVICE, AND SEMICONDUCTOR OPTICAL DEVICE

BACKGROUND OF THE INVENTION

The present invention relates to a method of soldering a semiconductor optical device to an object such as a printed circuit board, particularly to a method of soldering a semiconductor optical device including a resin-made optical lens by a reflow soldering process using a lead-free solder, and to a semiconductor optical device for use in the method.

Light emitting diodes (LEDs) include bullet-type ones, chip-type ones and the like, and the bullet-type light emitting diodes generally have a structure in which a light emitting element and conductive members such as a cathode lead, an anode lead, a light emitting semiconductor chip and a lead thin wire or wires are encapsulated with a light transmitting resin. The chip-type light emitting diodes generally have a structure in which a pair of lead frames are extended from the inner bottom of a top-open box-like light emitting element casing to the exterior of the light emitting element casing, whereas a light emitting semiconductor chip, lead thin wires and the like are contained in the inside of the light emitting element casing, these components are connected, and the inside of the casing is encapsulated with a light transmitting resin. These light emitting diodes may each be provided on the encapsulating material with an optical lens for regulating the propagation direction of the light emitted, according to the use purpose thereof.

In addition, an image forming light receiving device unit used as a small camera equipped in a cellular phone or the like is provided with a condensing optical lens on the optical path of the light incident on a semiconductor chip serving as a light receiving device.

Since the semiconductor optical devices such as the light emitting diodes and the image forming light receiving device units including the resin-made optical lens are generally connected to a circuit board or the like by soldering, the resin used as the material of the optical lens must have thermal resistance against the heat received at the time of soldering to the circuit board or the like. Therefore, an epoxy resin has hitherto been used as the material of the optical lens.

On the other hand, in recent years, due to environmental concern, conversion from the conventional lead-tin alloy solders to lead-free solders has been under way. The lead-free solders are higher in melting temperature than the conventional lead-tin alloy solders, and the encapsulating resins hitherto used lack thermal resistance at the higher temperatures.

Particularly, in the reflow soldering process generally used as a method of soldering a semiconductor optical device to a circuit board, the thermal resistance temperature required of the material for the optical lens has been about 230° C. in the cases of the conventional lead-tin alloy solders, but is as high as about 250° C. or above in the cases of the lead-free solders. However, the conventional epoxy resin does not have thermal resistance to the higher temperatures, so that an attempt to conduct the soldering by the reflow soldering process using a lead-free solder would result in that the lens is distorted or deteriorated and that the lens would be incapable of functioning as a lens. Therefore, the reflow soldering process using a lead-free solder is not applicable to the soldering of the semiconductor optical devices, and it may be necessary to individually solder the semiconductor optical devices. The individual soldering leads to a lowering in productivity.

Although optical lenses include glass lenses, formation of minute lenses for the semiconductor optical devices from glass needs extremely intricate steps and, therefore, is impractical. It is applicable to mount the optical lenses to the semiconductor optical devices after the reflow soldering. However, the semiconductor optical devices are mounted to the circuit board at diverse positions. Therefore, it is difficult to automate such the mounting process, and the process steps would eventually be intricate.

Therefore, there has been a request for a reflow soldering process by which a semiconductor optical device including a resin-made optical lens can be soldered by a lead-free solder.

SUMMARY OF THE INVENTION

An object of the present invention is to provide a method by which even a semiconductor optical device including a resin-made optical lens can be soldered with high productivity by a reflow soldering process using a lead-free solder without causing deformation or deterioration of the optical lens. Another object of the present invention is to provide a semiconductor optical device for use in the method.

The present inventor has made extensive and intensive investigations for solving the above-mentioned problems. As a result, it has been found that, when a semiconductor optical device including a resin-made optical lens is soldered to an object by a reflow soldering process using a lead-free solder, if the semiconductor optical device includes a silicone resin-made optical lens as the resin-made optical lens, the semiconductor optical device including the resin-made optical lens can be soldered with high productivity without causing deformation or deterioration such as discoloration of the optical lens even in the case where the solder temperature condition is a high temperature as in the reflow soldering process using a lead-free solder.

In a first aspect, the present invention provides a method for soldering a semiconductor optical device including a resin-made optical lens to an object by a reflow soldering process using a lead-free solder, wherein a semiconductor optical device including a silicone resin-made optical lens as the resin-made optical lens is used.

In a second aspect, the present invention provides a semiconductor optical device including a resin-made optical lens to be soldered to an object by a reflow soldering process using a lead-free solder, wherein the resin-made optical lens is a silicone resin-made optical lens.

According to the present invention, a semiconductor optical device including a silicone resin-made optical lens as a resin-made optical lens is used, whereby soldering with high productivity can be performed without causing deformation or deterioration such as discoloration of the optical lens even when the soldering is conducted by a reflow soldering process using a lead-free solder where the soldering temperature condition is a high temperature.

DETAILED DESCRIPTION OF THE INVENTION

The soldering method according to the present invention is a method of soldering a semiconductor optical device, such as a light emitting diode and an image forming light receiving device unit, including a resin-made optical lens to an object such as a printed circuit board by a reflow soldering process using a lead-free solder. A semiconductor optical device including a silicone resin-made optical lens is used as the semiconductor optical device.

Figure 1:
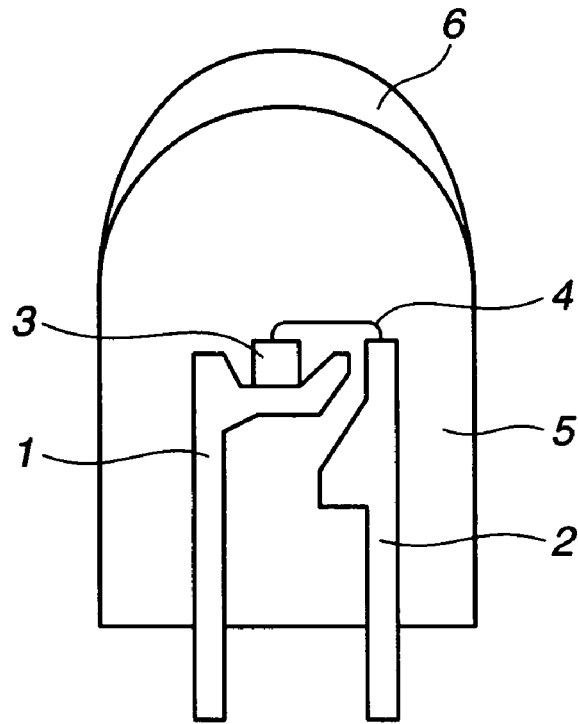
FIG. 1 is a sectional view of a semiconductor optical device (light emitting diode) according to one embodiment of the present invention.
Figure 2:
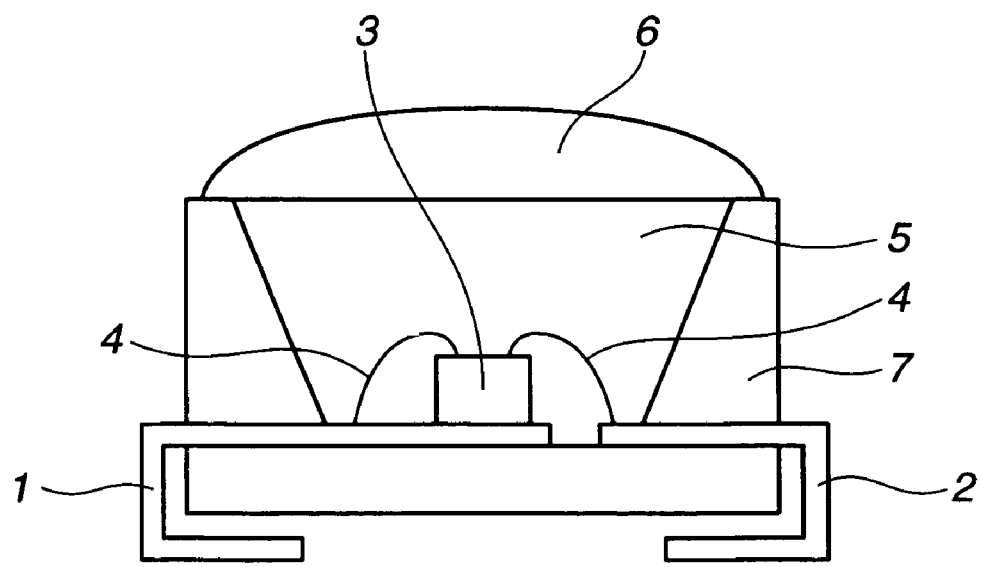
FIG. 2 is a sectional view of a semiconductor optical device (light emitting diode) according to another embodiment of the present invention.

The semiconductor optical device including a resin-made optical lens according to the present invention is a semiconductor optical device including a silicone resin-made optical lens, and examples thereof include a light emitting diode including a silicone resin-made optical lens integrally joined onto a light transmitting encapsulant which encapsulates a light emitter. More specifically, examples of the light emitting diode include a light emitting diode as shown in FIG. 1 in which a silicone resin-made optical lens 6 being crescent-like in section is integrally joined onto a top portion of a so-called bullet-type light emitting diode having a structure in which leads 1, 2, a light emitting semiconductor chip 3 as a light emitter, and a lead thin wire for electrically connecting the light emitting semiconductor chip 3 and the lead 2 to each other are encapsulated with a light transmitting resin 5 in a bullet-like shape. The examples of the light emitting diode also include a light emitting diode as shown in FIG. 2 in which a silicone resin-made optical lens 6 being bow-like in section is integrally joined to an upper portion of a so-called chip-type light emitting diode having a structure in which a pair of leads 1, 2 are extended from the inner bottom of a top-open box-like light emitter casing 7 to the exterior of the light emitter casing 7, a light emitting semiconductor chip 3 as a light emitter and lead thin wires 4, 4 are contained in the inside of the light emitter casing 7, these components are connected, and the inside of the casing 7 is encapsulated with a light transmitting resin 5.

As the silicone resin-made optical lens, there can be used various lenses such as spherical lens, non-spherical lens, and prism lens and Fresnel lens liable to deformation by heat.

In this case, the silicone resin-made optical lens and the light transmitting encapsulant are preferably adhered to each other by a condensation-type or addition-type silicone rubber adhesive or the like. In addition, the light transmitting encapsulant for encapsulating the light emitter is not particularly limited, inasmuch as the material has sufficient thermal resistance at the temperature applied in the reflow soldering process using a lead-free solder, i.e., a temperature of not less than about 250° C. A silicone resin encapsulant is more preferable from the viewpoints of thermal resistance and coefficient of thermal expansion.

Figure 3:
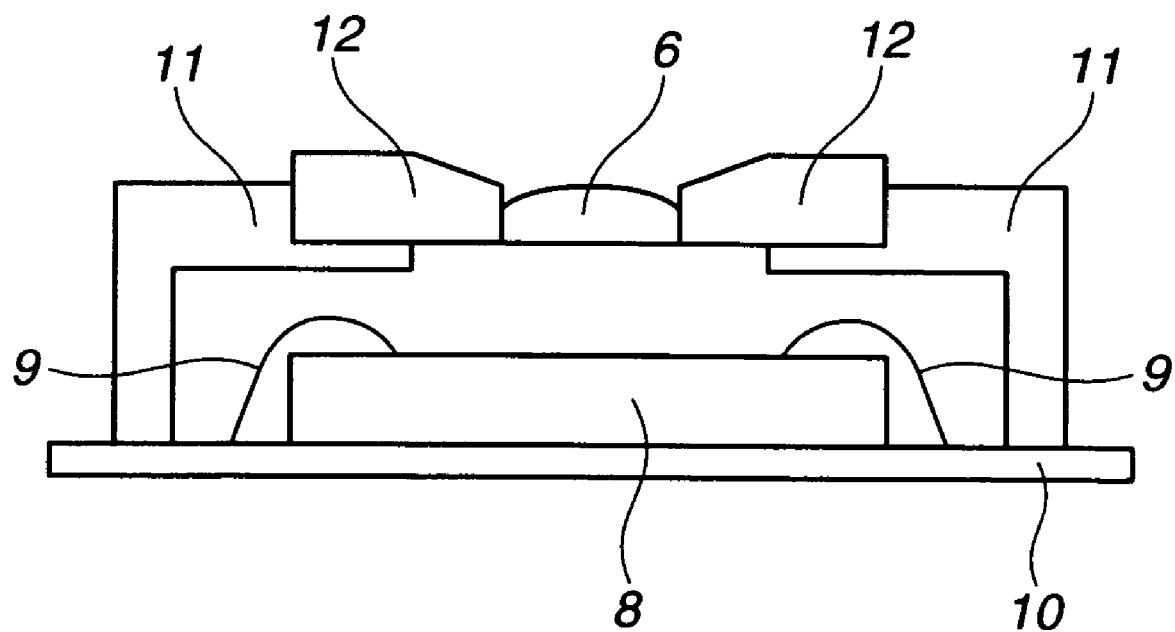
FIG. 3 is a sectional view of a semiconductor optical device (image forming light receiving device unit) according to a further embodiment of the present invention.

Other examples of the semiconductor optical device including a silicone resin-made optical lens according to the present invention include an image forming light receiving device unit incorporating a light receiving device and a silicone resin-made optical lens. More specific examples include an image forming light receiving device unit as shown in FIG. 3 in which a light receiving semiconductor chip (light receiving device) 8, leads 9, 9, and a silicone resin-made optical lens 6 for condensing light to the light receiving semiconductor chip 8 are incorporated integrally. Incidentally, in FIG. 3, symbol 10 denotes a substrate, 11 denotes a protective cover, and 12 denotes a lens frame.

In the present invention, the optical lens is a resin-made optical lens formed of a silicone resin. Such a silicone resin-made optical lens can be obtained by curing a silicone resin composition. As the silicone resin composition, particularly preferred is a liquid type addition curable silicone resin composition. The liquid type addition curable silicone resin composition is preferable because it is solventless and, hence, can be cured uniformly at both the surface and the inside thereof without foaming.

The addition curable silicone resin composition is not particularly limited inasmuch as it forms a transparent silicone resin by heat curing, and examples thereof include those which contain an organopolysiloxane as a base polymer together with an organohydrogenpolysiloxane and a heavy metal catalyst such as platinum catalyst.

Examples of the organopolysiloxane include those which are represented by the following average unit formula:

$$R_aSiO_{(4-a)/2}$$

where R is a unsubstituted or substituted univalent hydrocarbon group, preferably having 1 to 10 carbon atoms, particularly 1 to 8 carbon atoms, and a is a positive number of 0.8 to 2, particularly 1 to 1.8. Here, examples of R include alkyl groups such as methyl, ethyl, propyl, butyl, etc.; alkenyl groups such as vinyl, allyl, butenyl, etc.; aryl groups such as phenyl, tolyl, etc.; aralkyl groups such as benzyl, etc.; halogen-substituted hydrocarbon groups derived from the above-mentioned groups by substituting a part or the whole of the hydrogen atoms bonded to a carbon atom by a halogen atom or atoms, such as chloromethyl, chloropropyl, 3,3,3-trifluoropropyl, etc.; and cyano-substituted hydrocarbon groups derived from the above-mentioned groups by substituting a part or the whole of the hydrogen atoms bonded to a carbon atom by a cyano group or groups, such as 2-cyanoethyl, etc. R may be same or different each other. Those organopolysiloxanes which contain the phenyl group as R, particularly those organopolysiloxanes in which 5 to 80 mol % of all R groups are phenyl groups are more preferable from the viewpoints of thermal resistance and transparency of the optical lens.

The organopolysiloxane represented by the above average unit formula which contain the alkenyl group such as vinyl as R, particularly those organopolysiloxanes in which 1 to 20 mol % of all R groups are alkenyl groups, are preferable; among others, organopolysiloxanes containing two or more alkenyl groups per molecule are preferable. Examples of such organopolysiloxanes include alkenyl-terminated diorganopolysiloxanes having an alkenyl group such as vinyl at a terminal thereof, such as alkenyl-terminated dimethylpolysiloxane and alkenyl-terminated dimethylsiloxane-methylphenylsiloxane copolymer; particularly, those which are liquid at ordinary temperature are preferable.

On the other hand, as the organohydrogenpolysiloxane, those having a functionality of not less than three (namely, those having three or more silicon-bonded hydrogen atoms (Si—H groups) per molecule) are preferable, and examples thereof include methylhydrogenpolysiloxane, methylphenylhydrogenpolysiloxane, etc.; particularly, those which are liquid at ordinary temperature are preferable. In addition, examples of the catalyst include platinum, platinum compounds, organometallic compounds such as dibutyltin diacetate and dibutyltin dilaurate, and metal fatty acid salts such as tin octenoate. The kinds and amounts of the organohydrogenpolysiloxane and the catalyst may be appropriately determined taking into account the degree of crosslinking and the curing rate. Other than the above-mentioned components, filler, heat-resisting material, plasticizer or the like additives may be added into the silicone resin composition in the ranges as not to spoil the strength or transparency of the silicone resin obtained therefrom.

Besides, phosphor, light diffusing agent, and nano-sized silica, glass powder, glass filler or the like for reducing linear expansion, and the like additives may be added, according to the use of the lens.

Examples of the silicone resin composition which can be used include such commercially available products as KJR632 produced by Shin-Etsu Chemical Co., Ltd. and SR7010 produced by Dow Corning Toray Silicone Co., Ltd.

The optical lens can be obtained by a conventionally known method in which the above-mentioned silicone resin composition is molded into a silicone resin molding; for example, the optical lens can be molded by injection molding, extrusion molding, cast molding or the like. Incidentally, the hardness of the lens, in terms of Shore D hardness measured by the method according to JIS K 7215 (durometer hardness test method for plastics), is preferably in the range of 20 to 90, particularly 50 to 80.

In the next place, the soldering method according to the present invention is described.

As for the soldering of the semiconductor optical device in the present invention, the semiconductor optical device including the silicone resin-made optical lens described above is soldered by a reflow soldering process using a lead-free solder. Therefore, the optical lens is heated to the soldering temperature at the time of soldering.

Examples of the lead-free solder used in the present invention include Sn—Ag type solder, Sn—Sb type solder, Sn—Ag—Sb type solder, Sn—Ag—Cu type solder, and Sn—Bi type solder. The present invention is preferable in the cases of using a lead-free solder having a melting temperature of not less than 240° C., particularly not less than 260° C.

On the other hand, the reflow soldering process is not particularly limited, and a conventionally known reflow soldering process can be applied. For example, the soldering can be conducted by applying the lead-free solder by plating to an object such as a printed circuit board, or laminating a solder paste, a solder wire, a solder foil, a molded solder or the like on the object, mounting the leads of the semiconductor optical device including the silicone resin-made optical lens on the solder area, and heating the object as a whole or the solder area by a known heating method such as the IR method, vapor phase method, hot airflow method, laser method, etc. The present invention is preferable for the cases where the heating temperature is not less than 250° C., particularly not less than 260° C.

EXAMPLE

The present invention will be described in detail below by showing a working example thereof, but the invention is not to be construed as limited to the following example.

Example 1

As a resin composition, KJR632 (a product by Shin-Etsu Chemical Co., Ltd.), which is a silicone resin composition containing as a base polymer an organopolysiloxane having silicon-bonded phenyl groups, was used. The silicone resin composition was poured into an optically processed lens mold, and was cured at 170° C. for 10 min, to obtain an optical lens of silicone resin being crescent-like in section as shown in FIG. 1.

Next, the optical lens was adhered to a top portion of a bullet-type light emitting diode as shown in FIG. 1 obtained by using a light transmitting silicone resin as an encapsulant, with a transparent condensation type silicone rubber adhesive, to obtain a light emitting diode having the silicone resin-made optical lens integrally joined onto the light transmitting encapsulant.

Next, a solder paste containing an Sn—Ag—Cu lead-free solder (melting temperature: 250° C.) was applied to a substrate, the leads of the light emitting diode were mounted thereon, and soldering was conducted by a reflow soldering process of heating the substrate as a whole at 260° C. for 10 sec. After cooling, the light emitting diode was observed, to find that the diode was free of any deformation or deterioration such as discoloration of the optical lens. Besides, an electric current was passed to the light emitting diode, and the optical path and luminance of the emitted light were measured. The emitted light showed the same optical path, the same tone, and the same luminance as those observed before the soldering.

The invention claimed is:

1. A method for soldering a semiconductor optical device comprising a resin-made optical lens comprising:
    providing an object comprising a printed circuit board;
    applying a lead-free solder by plating to said object, or laminating a lead-free solder paste, a lead-free solder wire, a lead-free solder foil or a melted lead-free solder on said object;
    mounting leads of the semiconductor optical device on the solder area; and
    reflowing said lead-free solder by heating said object as whole or the solder area, wherein
    said lead-free solder has a melting temperature of not less than 250° C.,
    said resin-made optical lens comprises a silicone resin-made optical lens and is integrally joined with said semiconductor optical device, and
    said silicone resin-made optical lens has a Shore D hardness of 20 to 90 measured by a method according to JIS K 7215.

2. A method for soldering a semiconductor optical device of claim 1, wherein the semiconductor optical device comprising the resin-made optical lens is a light emitting diode comprising the silicone resin-made optical lens integrally joined onto a light-transmitting encapsulant which encapsulates a light emitter.

3. A method for soldering a semiconductor optical device of claim 1, wherein the semiconductor optical device comprising the resin-made optical lens is an image forming light receiving device unit incorporating a light receiving device and the silicone resin-made optical lens.

4. A method for soldering a semiconductor optical device of claim 1, wherein a heating temperature for the reflow soldering is not less than 250° C.

5. A method for soldering a semiconductor optical device of claim 1, further comprising:
    curing a silicone resin composition to form the silicone resin-made optical lens.

6. A method for soldering a semiconductor optical device of claim 5, wherein the silicone resin composition is a liquid type addition curable silicone resin composition.

7. A method for soldering a semiconductor optical device of claim 6, wherein the liquid type addition curable silicone resin composition comprises an organopolysiloxane as a base polymer, an organohydrogenpolysiloxane and a heavy metal catalyst.

8. A method for soldering a semiconductor optical device of claim 7, wherein the organopolysiloxane is represented by an average unit formula $R_a SiO_{(4-a)/2}$, and R is a unsubstituted or substituted univalent hydrocarbon group.

9. A semiconductor optical device comprising a resin-made optical lens to be soldered to a printed circuit board by a reflow soldering process using a lead-free solder having a melting temperature of not less than 250° C., wherein the resin-made optical lens is a silicone resin-made optical lens, and the silicone resin-made optical lens has a Shore D hardness of 20 to 90 measured by a method according to JIS K 7215.

10. A semiconductor optical device of claim 9, wherein the semiconductor optical device comprising the resin-made optical lens is a light emitting diode comprising the silicone resin-made optical lens integrally joined onto a light transmitting encapsulant which encapsulates a light emitter.

11. A semiconductor optical device of claim 9, wherein the semiconductor optical device comprising the resin-made optical lens is an image forming light receiving device unit incorporating a light receiving device and the silicone resin-made optical lens.

12. A semiconductor optical device of claim 9, wherein a heating temperature for the reflow soldering is not less than 250° C.

13. A semiconductor optical device of claim 9, wherein the silicone resin-made optical lens comprises a cured silicone resin composition.

14. A semiconductor optical device of claim 13, wherein the silicone resin composition is a liquid type addition curable silicone resin composition.

15. A semiconductor optical device of claim 14, wherein the liquid type addition curable silicone resin composition comprises an organopolysiloxane as a base polymer, an organohydrogenpolysiloxane and a heavy metal catalyst.

16. A semiconductor optical device of claim 15, wherein the organopolysiloxane is represented by an average unit formula $R_a SiO_{(4-a)/2}$, and R is a unsubstituted or substituted univalent hydrocarbon group.

* * * * *